(12) United States Patent
Tang

(10) Patent No.: US 10,355,140 B1
(45) Date of Patent: Jul. 16, 2019

(54) TRANSISTOR WITH SONOS STRUCTURE HAVING BARRIER WALL OVER ADJACENT PORTIONS OF THE SELECT TRANSISTOR WELL AND MEMORY TRANSISTOR WELL

(71) Applicant: Shanghai Huali Microelectronics Corporation, Shanghai (CN)

(72) Inventor: Xiaoliang Tang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/944,802

(22) Filed: Apr. 4, 2018

(30) Foreign Application Priority Data

Dec. 26, 2017 (CN) .......................... 2017 1 1430506

(51) Int. Cl.
*H01L 21/28* (2006.01)
*H01L 29/792* (2006.01)
*H01L 29/66* (2006.01)
*H01L 29/423* (2006.01)

(52) U.S. Cl.
CPC ...... *H01L 29/792* (2013.01); *H01L 21/28282* (2013.01); *H01L 29/42344* (2013.01); *H01L 29/66833* (2013.01)

(58) Field of Classification Search
CPC ............... H01L 21/28282; H01L 21/77; H01L 21/8229; H01L 21/8239
See application file for complete search history.

(56) References Cited

U.S. PATENT DOCUMENTS

2016/0043098 A1* 2/2016 Nakanishi ......... H01L 27/11573
438/283

* cited by examiner

*Primary Examiner* — Hoai V Pham
(74) *Attorney, Agent, or Firm* — Kilpatrick Townsend & Stockton, LLP

(57) ABSTRACT

The present disclosure provides a manufacturing method for a transistor with an SONOS structure, including providing a semiconductor substrate, wherein the semiconductor substrate includes a select transistor well and a memory transistor well; depositing an oxide layer on an upper surface of the select transistor well, depositing an ONO memory layer on an upper surface of the memory transistor well, depositing a barrier wall over adjacent portions of the select transistor well and the memory transistor well, depositing polycrystalline silicon covering the oxide layer, the ONO memory layer, and the barrier wall, and etching the polycrystalline silicon, to retain the polycrystalline silicon deposited on both sides of the barrier wall so as to form a select gate and a memory gate, and removing the oxide layer and the ONO layer on a surface of the semiconductor substrate other than the select gate, the barrier wall, and the memory gate.

12 Claims, 13 Drawing Sheets

TRANSISTOR WITH SONOS STRUCTURE HAVING BARRIER WALL OVER ADJACENT PORTIONS OF THE SELECT TRANSISTOR WELL AND MEMORY TRANSISTOR WELL

CROSS-REFERENCES TO RELATED APPLICATIONS

The present application claims priority to Chinese Patent Application No. 201711430506.6, filed on Dec. 26, 2017, entitled "TRANSISTOR WITH SONOS STRUCTURE AND MANUFACTURING METHOD THEREFOR", which is incorporated by reference herein for all purposes.

TECHNICAL FIELD

The present disclosure relates to a transistor with an SONOS structure and a manufacturing method therefor, and more particularly, to a transistor with an SONOS structure having a reduced critical dimension and a manufacturing method therefor.

BACKGROUND

Since the disclosure of integrated circuits by Dr. Jack Kilby of Texas Instruments in early years, scientists and engineers have made numerous disclosures and improvements in semiconductor devices and processes. Over 50 years, the dimension of semiconductors have been significantly reduced, which translates into an increasing processing speed and decreasing power consumption. To date, the development of semiconductors has largely followed Moore's Law, which roughly states that the number of transistors in dense integrated circuits doubles about every two years. At present, semiconductor processes are developing toward below 20 nm, and some companies are embarking on 14 nm processes. Just to provide a reference herein, a silicon atom is about 0.2 nm, which means that the distance between two separate components manufactured by a 20 nm process is about only one hundred silicon atoms.

Semiconductor device manufacturing has therefore become increasingly challenging and advancing toward the physically possible limit. One of recent developments in semiconductor technologies has been the use of silicon germanium (SiGe) in semiconductor manufacturing. With the evolution of integrated circuit developments, the functional densities (for example, the number of interconnects per chip region) are also generally increasing as geometries (that is, the smallest elements or lines that can be produced using a process) are reduced. This downsizing process can often offer benefits by increasing productivity and lowering related costs. However, it is challenging how to design a reasonable transistor structure to reduce its volume.

Currently in integrated circuits, a smallest memory cell typically includes a memory transistor and a select transistor matching with the memory transistor, and the memory transistor portion has an SONOS (Silicon (gate)-Oxide-Nitride-Oxide-Silicon (substrate)) structure, and the select transistor portion is a conventional MOS tube. In the prior art, as shown in FIG. 1, a conventional smallest memory cell generally consists of a conventional nMOS transistor (select transistor) formed on a P-type well and an SONOS memory transistor formed on a memory well respectively, and includes an N-type semiconductor substrate 101, a select transistor P-type well 102, a memory transistor P-type well 103, a select gate 105 isolated from the select transistor well 102 by an oxide layer 104, and a memory gate 107 isolated from the memory transistor well 103 by an ONO layer 106.

As can be seen from FIG. 1, there is a large gap between the select gate 105 and the memory gate 107 in the conventional transistor with the SONOS structure. As semiconductor processes have become increasingly demanding on critical dimensions (CDs), the volume of elements is expected to decrease correspondingly. Therefore, there is an urgent need for a reasonable and simple manufacturing process to manufacture a small-dimension transistor with an SONOS structure, so that the small-dimension transistor with an SONOS structure can adapt to different work requirements as a smallest memory cell.

SUMMARY OF THE INVENTION

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

As described above, in order to obtain a small-dimension memory cell that can be processed by a relatively simple manufacturing process, the present disclosure provides a manufacturing method for a transistor with an SONOS structure. The method includes providing a semiconductor substrate, and the semiconductor substrate includes a select transistor well and a memory transistor well, depositing an oxide layer on an upper surface of the select transistor well, depositing an ONO memory layer on an upper surface of the memory transistor well, depositing a barrier wall over adjacent portions of the select transistor well and the memory transistor well, depositing polycrystalline silicon covering the oxide layer, the ONO memory layer, and the barrier wall, and etching the polycrystalline silicon, to retain the polycrystalline silicon deposited on both sides of the barrier wall so as to form a select gate and a memory gate, and removing the oxide layer and the ONO layer on a surface of the semiconductor substrate other than the select gate, the barrier wall, and the memory gate.

In an embodiment of the manufacturing method as described above, depositing the barrier wall includes depositing an isolation dielectric layer covering the oxide layer and the ONO memory layer, etching a portion of the isolation dielectric layer over the memory transistor well by using a first photomask and a preset exposure X1, to retain the isolation dielectric layer over the select transistor well and the portion of the memory transistor well adjacent to the select transistor well, and etching a portion of the isolation dielectric layer over the select transistor well by using a second photomask and a preset exposure Y1, to retain the isolation dielectric layer over the adjacent portions of the select transistor well and the memory transistor well so as to form the barrier wall, and the exposure X1 and the exposure Y1 are adjusted according to the width of the barrier wall.

In an embodiment of the manufacturing method as described above, forming the oxide layer includes depositing an oxide layer on the surface of the semiconductor substrate, and etching the oxide layer on the upper surface of the memory transistor well region by using the first photomask and a preset exposure X2, to retain the oxide layer on the upper surface of the select transistor well region, and the exposure X2 is greater than the exposure X1 to etch the oxide layer over the entire upper surface of the memory transistor well region.

In an embodiment of the manufacturing method as described above, the method further includes performing shallow trench ion implantation on the memory transistor well by using the first photomask, so as to form shallow trench doping.

In an embodiment of the manufacturing method as described above, forming the ONO memory layer on the upper surface of the memory transistor well includes depositing an ONO memory layer covering the oxide layer and the upper surface of the memory transistor well region of the semiconductor substrate, and etching the ONO memory layer over the select transistor well region by using the second photomask and a preset exposure Y2, to retain the ONO memory layer on the upper surface of the memory transistor well region, and the exposure Y2 is greater than the exposure Y1 to etch the ONO memory layer over the entire select transistor well region.

In an embodiment of the manufacturing method as described above, forming the ONO memory layer on the upper surface of the memory transistor well includes depositing an ONO memory layer covering the oxide layer and the upper surface of the memory transistor well region of the semiconductor substrate, and the isolation dielectric layer is deposited on an upper surface of the ONO memory layer, and etching portions of both the isolation dielectric layer and the ONO memory layer over the select transistor well by using the second photomask and the preset exposure Y1, to retain the ONO memory layer over the upper surface of the select transistor well and the portion of the select transistor well adjacent to the memory transistor well.

In an embodiment of the manufacturing method as described above, depositing the ONO memory layer covering the oxide layer and the upper surface of the memory transistor well region of the semiconductor substrate specifically includes: sequentially depositing a first oxide layer, a nitride layer, and a second oxide layer.

In an embodiment of the manufacturing method as described above, the select transistor well and the select transistor well are formed by performing ion implantation.

In an embodiment of the manufacturing method as described above, the barrier wall is of a dielectric material, and the width of the barrier wall is set according to operating voltages of the select transistor and the memory transistor.

In an embodiment of the manufacturing method as described above, the dielectric material is silicon nitride.

In an embodiment of the manufacturing method as described above, the semiconductor substrate is N-type doped, and the select transistor well and the memory transistor well are P-type doped.

In an embodiment of the manufacturing method as described above, the semiconductor substrate is P-type doped, and the select transistor well and the memory transistor well are N-type doped.

The present disclosure further provides a transistor with an SONOS structure, specifically including a semiconductor substrate, and the semiconductor substrate includes a select transistor well and a memory transistor well, a select gate formed over the select transistor well, with an oxide layer between the select gate and an upper surface of the select transistor well of the substrate, a memory gate formed over the memory transistor well, with an ONO memory layer between the memory gate and an upper surface of the memory transistor well of the substrate, and the oxide layer and the ONO memory layer are adjacent to each other, and a barrier wall structure is formed on upper surfaces of adjacent portions of the oxide layer and the ONO memory layer to isolate the select gate and the memory gate from each other, and the formation of the barrier wall is independent of the formation of the ONO memory layer.

In an embodiment of the transistor as described above, the ONO memory layer includes a first oxide layer, a nitride layer, and a second oxide layer.

In an embodiment of the transistor as described above, the barrier wall is of a dielectric material, and the width of the barrier wall is set according to operating voltages of the select transistor and the memory transistor.

In an embodiment of the transistor as described above, the dielectric material is silicon nitride.

In an embodiment of the transistor as described above, the select gate and the memory gate are symmetrical with respect to the barrier wall.

In an embodiment of the transistor as described above, the semiconductor substrate is N-type doped, and an select transistor well and memory transistor well are P-type doped.

In an embodiment of the transistor as described above, the semiconductor substrate is P-type doped, and select transistor well and memory transistor well are N-type doped.

According to the transistor with an SONOS structure and the manufacturing method therefor provided in the present disclosure, a smallest memory cell can be obtained by using a simple manufacturing process, and a select transistor and a memory transistor of the smallest memory cell are separated by a barrier wall, reducing the dimension of the transistor.

BRIEF DESCRIPTION OF THE DRAWINGS

FIGS. 2A-2H show schematic structural diagrams of a transistor in a manufacturing process according to an embodiment of the present disclosure.

DETAILED DESCRIPTION

Figure 1:
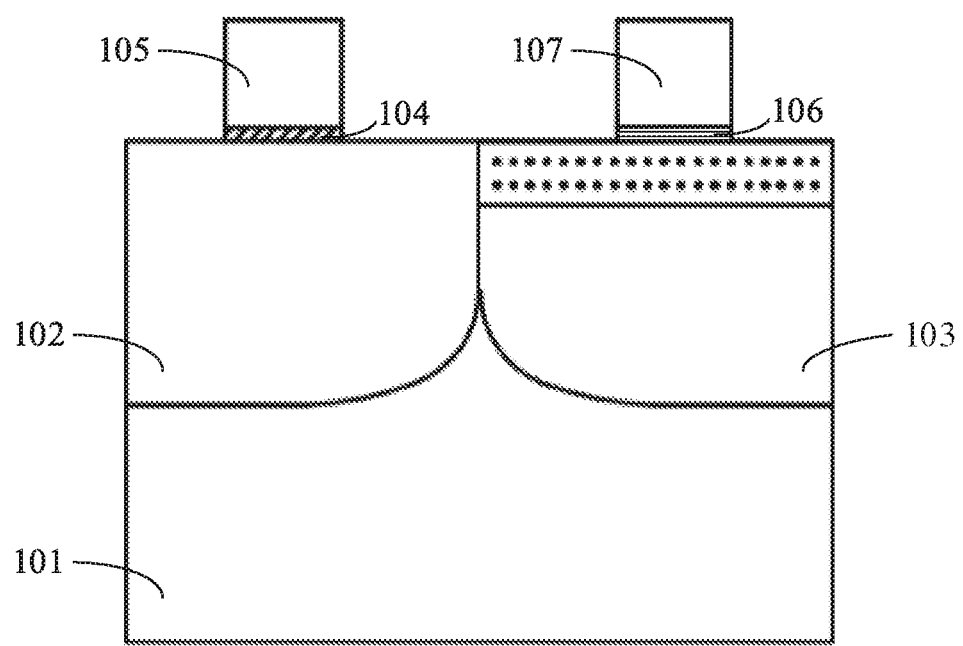
FIG. 1 shows a schematic diagram of a smallest memory cell in the prior art.

The present disclosure relates to a semiconductor process and device. Embodiments of the present disclosure provide a semiconductor device including a select gate and a memory gate, which are separated by a barrier wall between the select gate and the memory gate, effectively reducing a distance between the select gate and the memory gate, and decreasing the dimension of the transistor. The present disclosure also provides other embodiments.

In the following detailed description, numerous specific details are set forth to provide a more thorough understanding of the present disclosure. However, the present disclosure may not necessarily be limited to these specific details. In other words, well-known structures and devices are shown in the block diagram form and are not shown in detail to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any appended claims, the abstract, and the accompanying drawings) may be replaced by alternative features serving the same, equivalent, or similar purpose. Therefore, unless expressly stated otherwise, each feature disclosed is only one example of a group of equivalent or similar features.

Furthermore, an apparatus that is not expressly indicated in the claims as being used for performing a particular function, or any component as being used for performing a step of a particular function, should not be construed as a means or step provision as specified in 35 USC Section 112, Paragraph 6. In particular, the use of "step of . . ." or "action of . . ." in the claims herein does not indicate relating to the specifications in 35 USC § 112, Paragraph 6.

Note that when used, the flags left, right, front, back, top, bottom, front, back, clockwise, and counterclockwise are used for convenience purposes only and do not imply any specific fixed direction. In fact, they are used to reflect the relative position and/or direction between various parts of an object.

As used herein, the terms "over . . . ", "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

As described above, according to the transistor with an SONOS structure in the prior art, the distance between the selection gate 105 and the memory gate 107 is relatively far, which is not conducive to reducing the critical dimension of the transistor, and therefore, there is an urgent need for manufacturing a small-dimension transistor with an SONOS structure by using a reasonable and simple manufacturing process, so that the small-dimension transistor with an SONOS structure can adapt to different work requirements as a smallest memory cell. The present disclosure provides a transistor with an SONOS structure and a manufacturing method therefor, which can manufacture a smallest memory cell by using a simple manufacturing process, and reduce a distance between a memory gate and a select gate of the smallest memory cell, and reduce the volume of the smallest memory cell.

FIG. 2A-FIG. 2L show simplified diagrams illustrating a process procedure for providing a transistor with an SONOS structure according to an embodiment of the present disclosure. These diagrams provide examples only and should not unduly limit the scope of the claims. Depending on implementations, one or more steps may be added, removed, repeated, rearranged, modified, replaced, and/or alternated without affecting the scope of the claims.

Figure 2A:
FIG. 2A-FIG. 2L show schematic structural diagrams of a transistor in a manufacturing process according to an embodiment provided in the present disclosure.

As shown in FIG. 2A, a semiconductor substrate 201 used in the present disclosure is provided first. The substrate 201 may be a semiconductor wafer such as a silicon wafer. Alternatively or additionally, the substrate 201 may include an elemental semiconductor material, a compound semiconductor material, and/or an alloy semiconductor material. Examples of elemental semiconductor materials may be, but are not limited to, crystalline silicon, polycrystalline silicon, amorphous silicon, germanium, and/or diamond. Examples of compound semiconductor materials may be, but not limited to, silicon carbide, gallium arsenide, gallium phosphide, indium phosphide, indium arsenide, and/or indium antimonide. Examples of alloy semiconductor materials may be, but not limited to, SiGe, GaAsP, AlInAs, AlGaAs, GaInAs, GaInP, and/or GaInAsP.

Figure 2B:
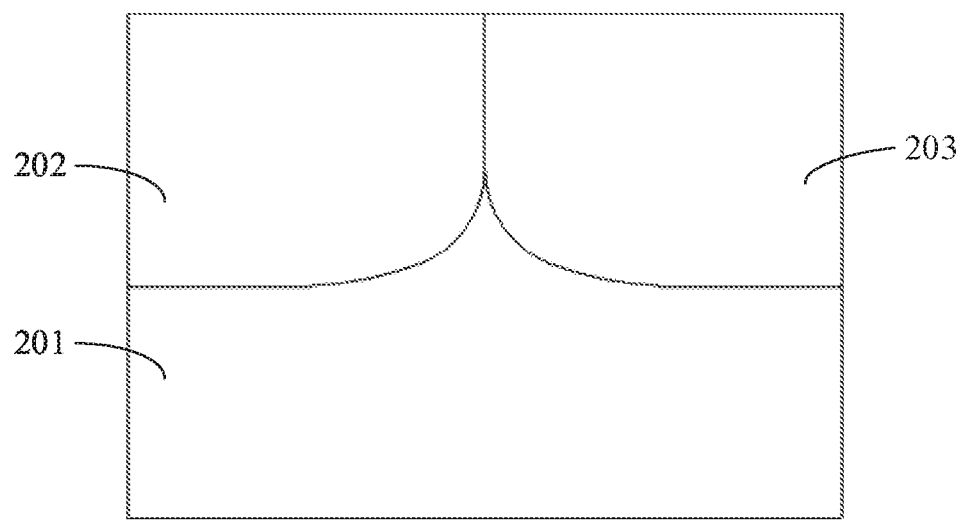

FIG. 2B shows ion implantation in the substrate 201 to form a select transistor well 202 and a memory transistor well 203 of the transistor. In this embodiment, the substrate 201 is N-type doped, and the select transistor well 202 and the memory transistor well 203 are P-type wells. In some embodiments, the substrate 201 may also be P-type doped, and the select transistor well 202 and the memory transistor well 203 may also be N-type wells. The formation of each well includes at least three to five steps to complete the fabrication, including, but not limited to, epitaxial growth, native oxide growth, ion implantation using a mask, and another high-energy ion implantation and annealing.

Figure 2C:
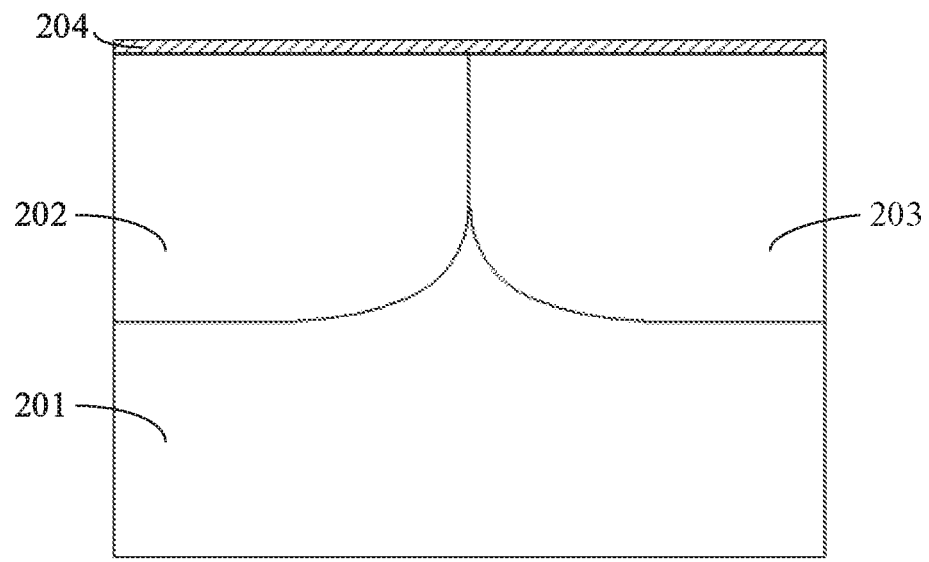
Figure 2D:
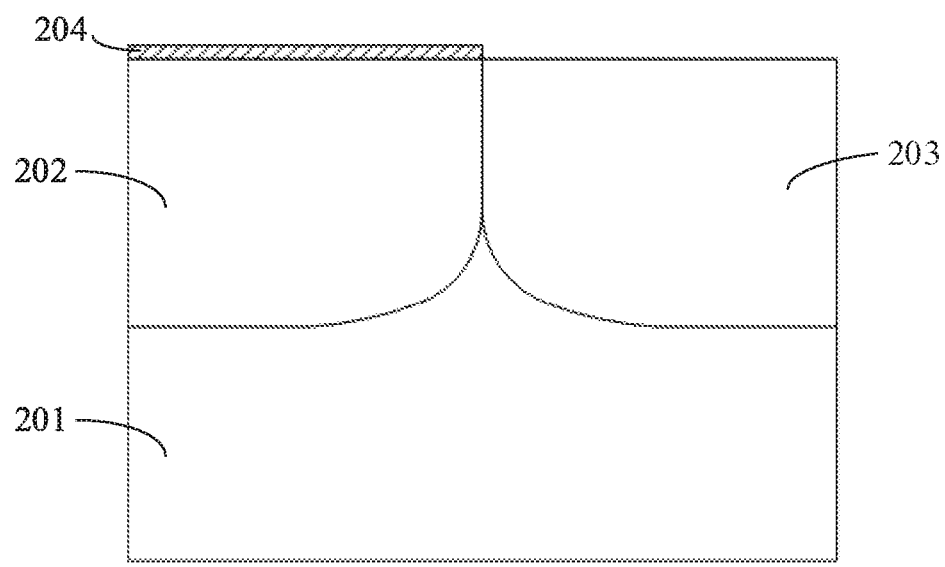

FIG. 2C-FIG. 2D show schematic structural diagrams of the transistor in a process of forming an oxide layer on an upper surface of the select transistor well 202. As shown in FIG. 2C, an oxide layer 204 is first deposited on a surface of the semiconductor substrate 201. The above deposition process includes, but is not limited to, forming the above oxide layer 204 by chemical vapor deposition (CVD), physical vapor deposition (PVD), atomic layer deposition (ALD), high density plasma CVD (HDPCVD), metal organic CVD (MOCVD), or plasma enhanced CVD (PECVD). As shown in FIG. 2D, the oxide layer on the upper surface of the select transistor well region 202 is retained by etching the oxide layer on an upper surface of the memory transistor well region 203. The above etching process may include dry etching, wet etching, and/or other etching methods (such as reactive ion etching). The etching process may also be purely chemical (plasma etching), purely physical (ion milling), and/or a combination of the foregoing.

In the above process, it is necessary to remove the oxide layer on the surface of the memory transistor well 203 and retain the oxide layer on the upper surface of the select transistor well 202. It is necessary to define the surface material region needing to be etched off by means of pattern etching by using a mask layer (usually a patterned photoresist), and a selected portion is etched off during etching, which is the oxide layer on the surface of the memory transistor well 203 in this step in this embodiment. The above patterning process may include photoresist coating (for example, spin coating), soft baking, photomask alignment, exposure, post-exposure baking, photoresist development, rinsing, drying (for example, hard baking), other suitable processes, and/or combinations thereof. In this embodiment, the above portion to be etched is patterned using a first photomask and a preset exposure of X2. In one embodiment, the above first photomask may reuse one of photomasks used in the prior art to form the conventional smallest memory cell as shown in FIG. 1, without the need to separately design and manufacture an additional photomask.

Figure 2E:
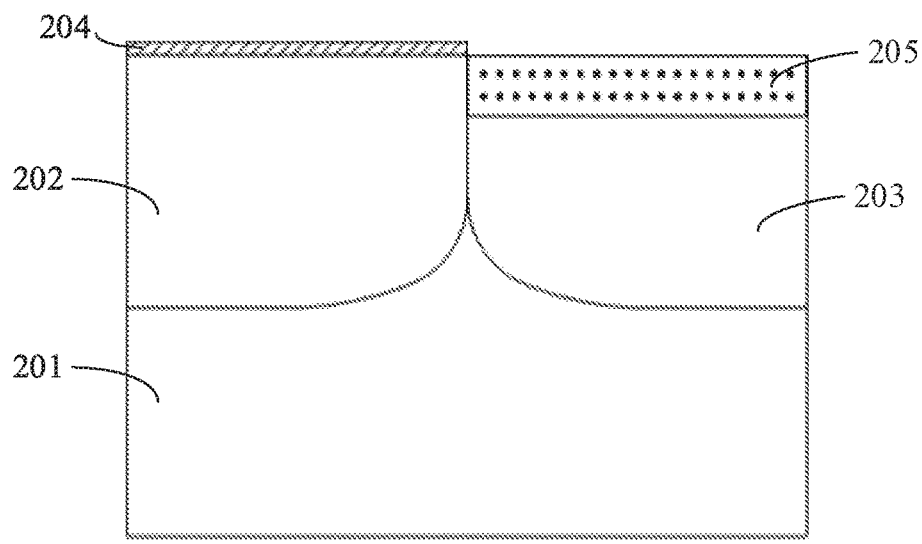

FIG. 2E shows a schematic structural diagram of the transistor after shallow trench ion implantation is performed in the memory transistor well 203. In this step, shallow trench ion implantation needs to be performed on the memory transistor well 203 region to form shallow trench doping 205, without the need for performing ion implantation on the select transistor well 202 region. Therefore, a patterned photoresist is still needed to define a region where ion implantation is to be performed. The above patterning process may include photoresist coating (for example, spin coating), soft baking, photomask alignment, exposure, post-exposure baking, photoresist development, rinsing, drying (for example, hard baking), other suitable processes, and/or combinations thereof. In this embodiment, the above region to be ion-implanted is patterned using the first photomask and the preset exposure of X2. In one embodiment, the above first photomask may reuse one of photomasks used in the prior art to form the conventional smallest memory cell as shown in FIG. 1, without the need to separately design and manufacture an additional photomask.

In another embodiment, the above shallow trench ion implantation process is performed after forming the oxide layer 204 on the upper surface of the select transistor well 202 region as shown in FIG. 2C-FIG. 2D, and then the patterned photoresist in the process shown in FIG. 2C-FIG. 2D is reused to define the region where ion implantation is performed, that is, the memory transistor well 203 region.

Figure 2F:
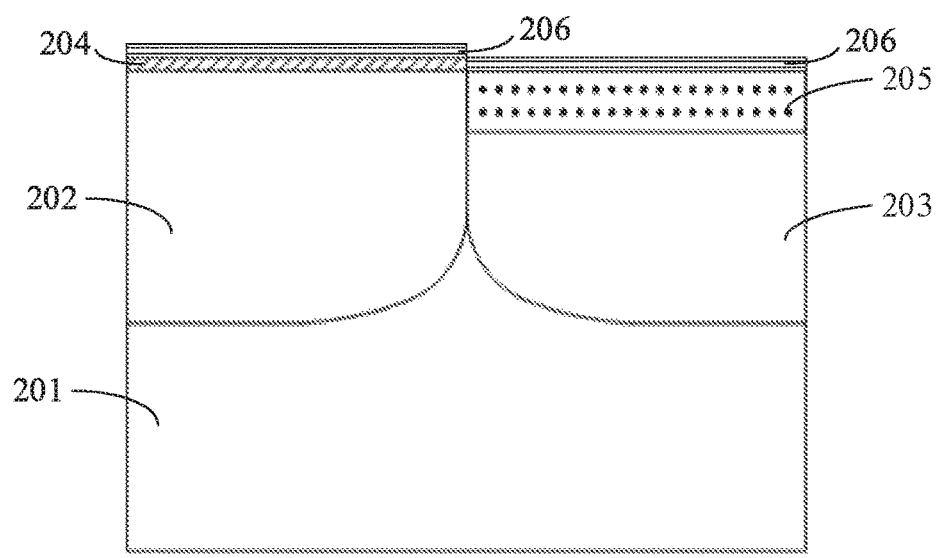
Figure 2G:
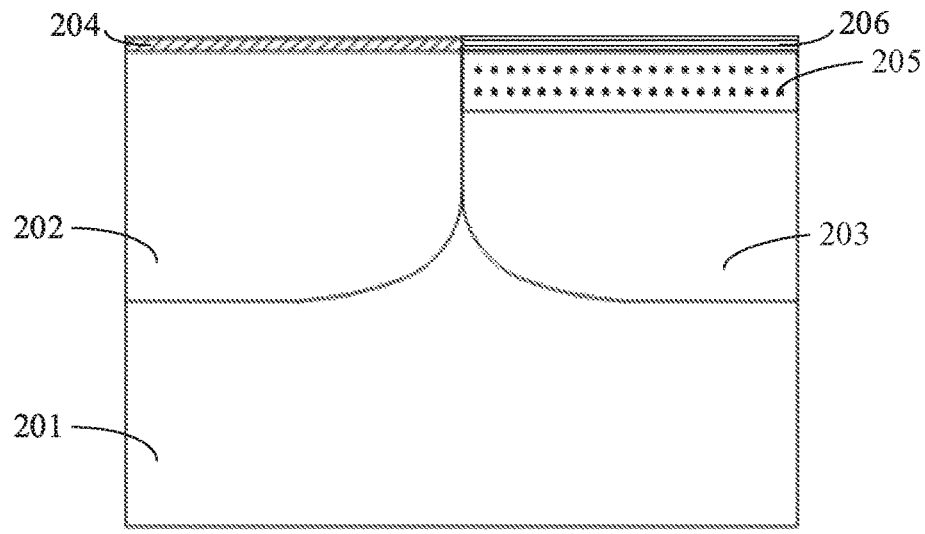

The ion implantation as shown in FIG. 2E, where the above ion implantation is P-type doping if the memory transistor is an N-type well, may have a dopant such as boron (B), indium (In), or another group III element, and the junction depth of the above ion implantation is set according to the electrical performance of the memory transistor well 203 region. The memory transistor well 203 region is P-type doped as a well for a memory transistor. If the memory transistor well is a P-type well, the above ion implantation may be N-type doping, and the dopant may be phosphorus (P), arsenic (As), or another Group V element. FIG. 2F-FIG. 2G show schematic structural diagrams of the transistor in a process of forming an ONO layer on the upper surface of the select transistor well 203. The process of depositing the oxide layer 206 on the surface of the semiconductor substrate 201 includes sequentially depositing a first oxide layer, a nitride layer, and a second oxide layer on the transistor. The above deposition process includes, but is not limited to, forming the above ONO layer 206 by chemical vapor deposition (CVD), physical vapor deposition (PVD), atomic layer deposition (ALD), high density plasma CVD (HDPCVD), metal organic CVD (MOCVD), or plasma enhanced CVD (PECVD). As shown in FIG. 2G, the ONO layer on the upper surface of the memory transistor well 203 region is retained by etching the ONO layer on the select transistor well region 202. The above etching process may include dry etching, wet etching, and/or other etching methods (such as reactive ion etching). The etching process may also be purely chemical (plasma etching), purely physical (ion milling), and/or a combination of the foregoing.

In the above process, it is necessary to remove the ONO layer on the selectron region 202 and retain the ONO layer on the upper surface of the memotron region 203. It is necessary to define the surface material region needing to be etched off by means of pattern etching by using a mask layer (usually a patterned photoresist), and a selected portion is etched off during etching, which is the ONO layer on the selectron region 202 in this step in this embodiment. The above patterning process may include photoresist coating (for example, spin coating), soft baking, photomask alignment, exposure, post-exposure baking, photoresist development, rinsing, drying (for example, hard baking), other suitable processes, and/or combinations thereof. In this embodiment, the above portion to be etched is patterned using a second photomask and a preset exposure of Y2. In one embodiment, the above second photomask may reuse one of photomasks used in the prior art to form the conventional smallest memory cell as shown in FIG. 1, without the need to separately design and manufacture an additional photomask.

Figure 2H:
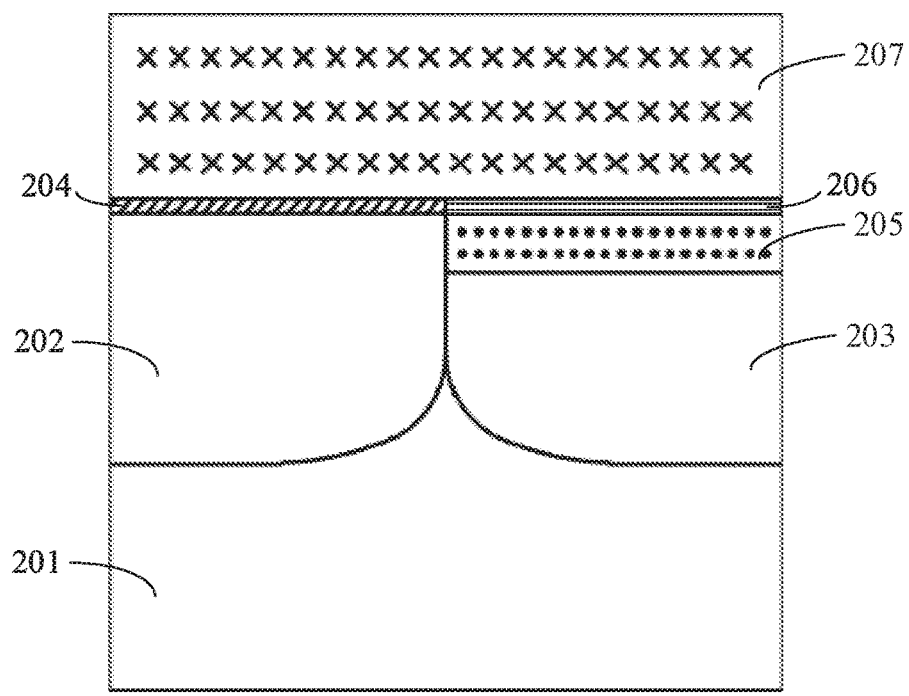
Figure 2I:
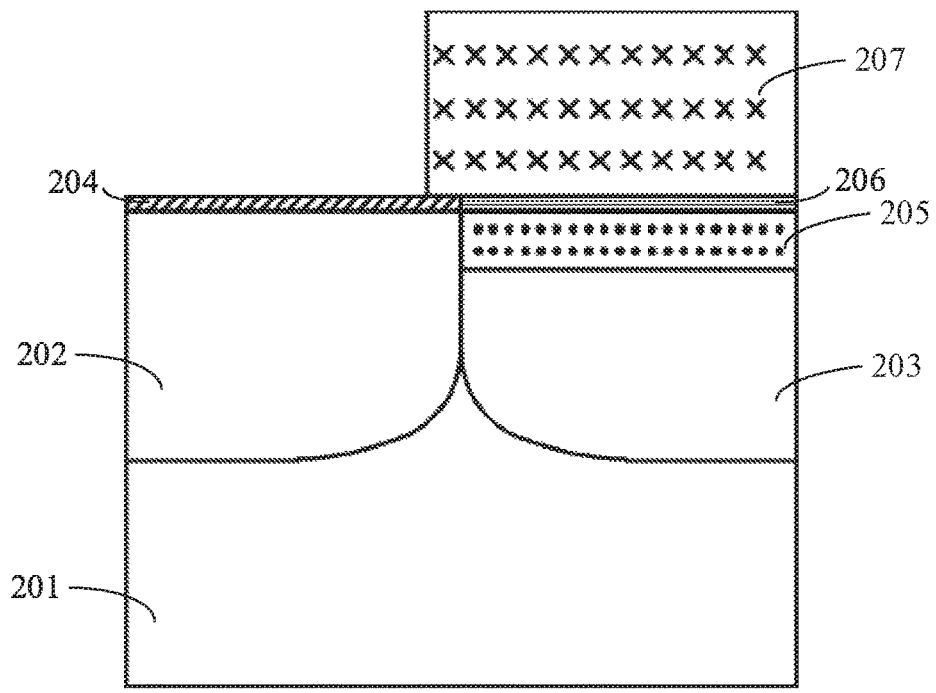
Figure 2J:
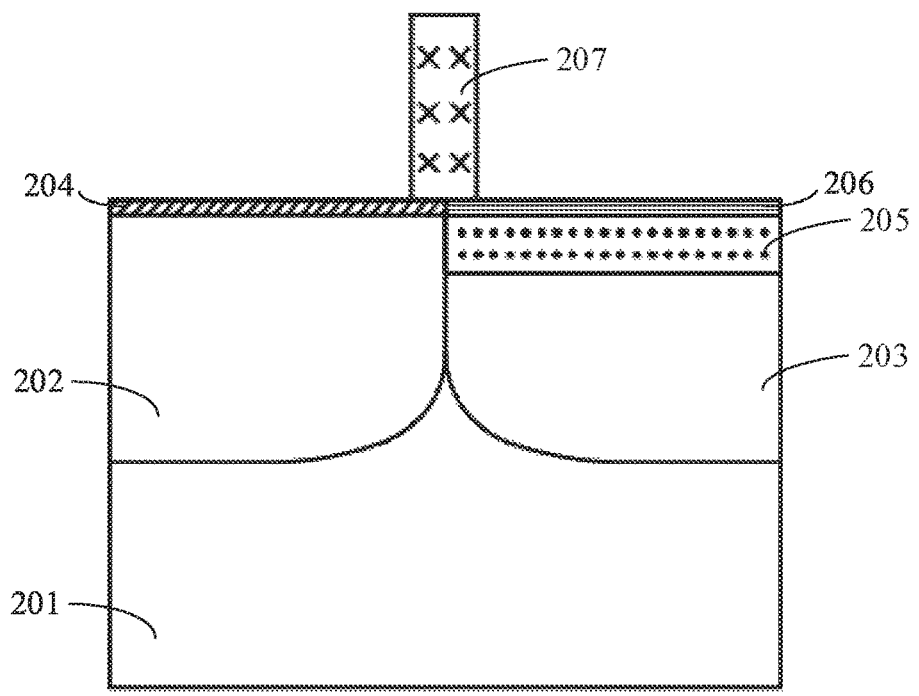

FIG. 2H-FIG. 2J show schematic structural diagrams of the transistor in a process of forming a barrier wall according to an embodiment of the present disclosure. After the ONO layer 206 is formed on the surface of the memory transistor well 203 as shown in FIG. 2G, as shown in FIG. 2H, an isolation dielectric layer 207 is deposited on the above transistor. The above deposition process includes, but is not limited to, chemical vapor deposition (CVD), physical vapor deposition (PVD), atomic layer deposition (ALD), high density plasma CVD (HDPCVD), metal organic CVD (MOCVD), or plasma enhanced CVD (PECVD) to form the above isolation dielectric layer 207. As shown in FIG. 2I, the barrier wall dielectric layer on the memory transistor well 203 region and the junction of the select transistor well 202 and the memory transistor well 203 are retained by etching the barrier wall dielectric layer on a portion of the select transistor well region 202. The above etching process may include dry etching, wet etching, and/or other etching methods (such as reactive ion etching). The etching process may also be purely chemical (plasma etching), purely physical (ion milling), and/or a combination of the foregoing.

In the above process, it is necessary to remove the barrier wall dielectric layer on a part of the select transistor well 202 while retaining the barrier wall dielectric layer on the memory transistor well 203 region and the junction of the select transistor well 202 and the memory transistor well 203. It is necessary to define the surface material region needing to be etched off by means of pattern etching by using a mask layer (usually a patterned photoresist), and a selected portion is etched off during etching, which is the barrier wall dielectric layer on the surface of the part of the select transistor well 202 in this step in this embodiment. The above patterning process may include photoresist coating (for example, spin coating), soft baking, photomask alignment, exposure, post-exposure baking, photoresist development, rinsing, drying (for example, hard baking), other suitable processes, and/or combinations thereof. In this embodiment, the above portion to be etched is patterned using the second photomask and the preset exposure of Y1 as described above, without the need to separately design and manufacture an additional photomask. Since the pattern to be etched is the same as that of removing the ONO layer on the select transistor well 202 region in the step as shown in FIG. 2G, with a difference in dimension, the above dimension may be adjusted by controlling the exposure. A photoresist region exposed to light passing through the photomask may decompose during subsequent development, thereby revealing the region to be etched. In the exposure process, the dimension of the pattern can be adjusted by adjusting the energy of the light, that is, the exposure in this application. Common factories may adjust the size of the exposed pattern in this way, and lower energy may result in a smaller pattern, that is, the etched region is smaller. Therefore, in this embodiment, the preset exposure of Y1 is used, and the above exposure of Y1 is less than the exposure of Y2 in the step as shown in FIG. 2G, so that upon removal of the barrier wall dielectric layer on the select transistor well 202 region, the barrier wall dielectric layer on the portion of the select transistor well 202 region can be retained at the junction of the select transistor well 202 and the memory transistor well 203 region. The width of the above retained barrier wall dielectric layer on the portion of the select transistor well 202 region is adjusted according to the exposure. When the value of Y1 is smaller, the retained barrier wall dielectric layer is more, and the width of the subsequent formed barrier wall is greater, enabling the smallest memory cell to operate at a higher voltage.

As shown in FIG. 2J, the barrier wall dielectric layer at the junction of the select transistor well 202 and the memory transistor well 203 is retained by etching the barrier wall dielectric layer on a portion of the memory transistor well region 203, so as to form a barrier wall structure. The above etching process may include dry etching, wet etching, and/or other etching methods (such as reactive ion etching). The etching process may also be purely chemical (plasma etching), purely physical (ion milling), and/or a combination of the foregoing.

In the above process, it is necessary to remove the barrier wall dielectric layer on a part of the memory transistor well 203 while retaining the barrier wall dielectric layer at the junction of the select transistor well 202 and the memory transistor well 203. It is necessary to define the surface material region needing to be etched off by means of pattern etching by using a mask layer (usually a patterned photoresist), and a selected portion is etched off during etching, which is the barrier wall dielectric layer on the surface of the part of the memory transistor well 203 in this step in this embodiment. The above patterning process may include photoresist coating (for example, spin coating), soft baking, photomask alignment, exposure, post-exposure baking, photoresist development, rinsing, drying (for example, hard baking), other suitable processes, and/or combinations thereof. In this embodiment, the above portion to be etched is patterned using the first photomask and the preset exposure of X1 used in the step as shown in FIG. 2D, without the need to separately design and manufacture an additional photomask. Since the pattern to be etched is the same as that of removing the oxide layer on the memory transistor well 203 region in the step as shown in FIG. 2D, with a difference in dimension, the above dimension may be adjusted by controlling the exposure. The photomask determines an exposed pattern of the photoresist. In the exposure process, the dimension of the pattern can be adjusted by adjusting the energy of the light, that is, the exposure in this application. Common factories may adjust the size of the exposed pattern in this way, and lower energy may result in a smaller pattern, that is, the etched region is smaller. Therefore, in this embodiment, the preset exposure of X1 is used, and the value of the above exposure X1 is less than the exposure of X2 in the step as shown in FIG. 2D, so that upon removal of the barrier wall dielectric layer on the memory transistor well 203 region, the barrier wall dielectric layer on the portion of the memory transistor well 203 region can be retained at the junction of the select transistor well 202 and the memory transistor well 203 region. The width of the above retained barrier wall dielectric layer on the portion of the memory transistor well 203 region is adjusted according to the exposure. When the value of X1 is smaller, the retained barrier wall dielectric layer is more, and the width of the subsequent formed barrier wall is greater, enabling the smallest memory cell to operate at a higher voltage.

The transistor, as shown in FIG. 2J, eventually forms a barrier wall over adjacent portions of the select transistor well 202 region and the memory transistor well 203 region. The material of the above barrier wall is the dielectric material deposited in the step as shown in FIG. 2H. In one embodiment, the above dielectric material may use silicon nitride. Furthermore, as described above, the width of the barrier wall is associated with the exposures Y1 and X1 used in the steps as shown in FIG. 2I and FIG. 2J. The width of the barrier wall is related to the operating voltage of the smallest memory cell. When the operating voltage of the smallest memory cell is higher, a thicker barrier wall is needed to ensure that the barrier wall may not break down at the higher operating voltage, and enable the isolation of the select gate from the memory gate and ensure that the smallest memory cell operates in a safe state. When the operating voltage of the smallest memory cell is lower, the width of the above barrier wall may be appropriately reduced while ensuring the safety performance, so as to achieve the effect of reducing the volume of the transistor more optimally.

Figure 2K:
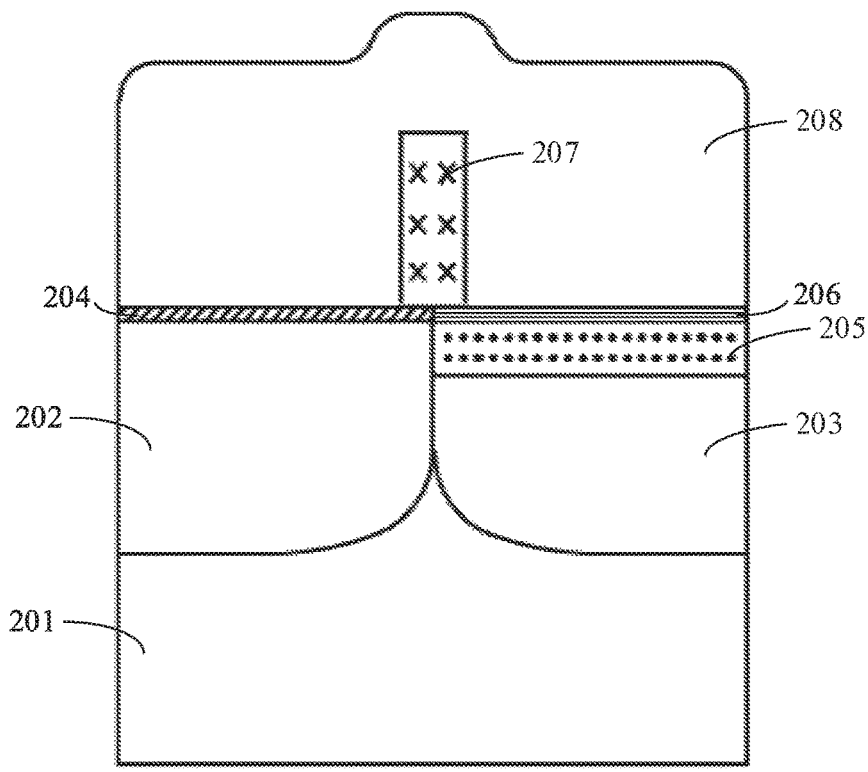
Figure 2L:
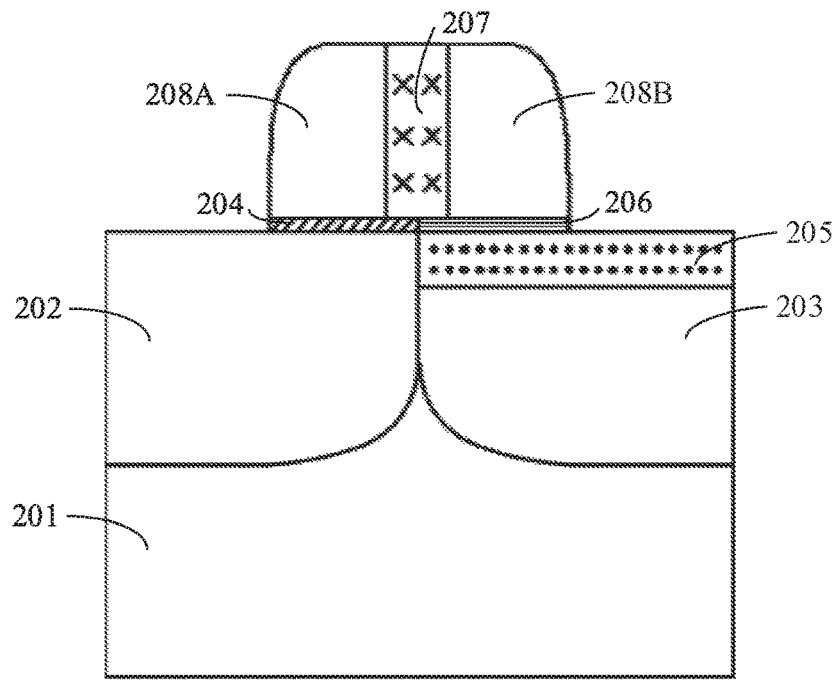

FIG. 2K-FIG. 2L show schematic structural diagrams in a process of forming the select gate and the memory gate of the smallest memory cell. As shown in FIG. 2K, polycrystalline silicon 208 is deposited on the transistor. The above deposition process includes, but is not limited to, forming the above polycrystalline silicon 208 by chemical vapor deposition (CVD), physical vapor deposition (PVD), atomic layer deposition (ALD), high density plasma CVD (HDP-CVD), metal organic CVD (MOCVD), or plasma enhanced CVD (PECVD). FIG. 2L shows a schematic structural diagram of the smallest memory cell after etching. The polycrystalline silicon 208 formed on two sides of the barrier wall is retained by etching according to requirements of the smallest memory cell for the select gate and the memory gate, and due to the existence of the barrier wall, the select gate 208A and the memory gate 208B are formed on the two sides of the barrier wall. Moreover, while the above select gate 208A and the memory gate 208B are formed by etching, the superfluous oxide layer over the select transistor well 202 where the select gate 208A region is not formed is removed, and the superfluous ONO layer above the memory transistor well 203 where the memory gate 208B is not formed is removed.

The above select gate 208A and the memory gate 208B are formed symmetrically to each other on the two sides of the barrier wall at the same time to form both the select gate 208A and the memory gate 208B with symmetric structures, so that effects of the manufacturing process on the select gate 208A and the memory gate 208B are quite close, which can prevent the occurrence of errors therebetween. In this embodiment, the effect of forming both the select gate 208A and the select gate 208B can be achieved without the need of depositing the polycrystalline silicon a plurality of times, and different from depending on a photomask plate, photoetching, and etching, the trench length of the gate tubes depends on only etching of the polycrystalline silicon layer, which greatly improves the uniformity among transistors and improves the reliability of a memory region.

The smallest memory cell as shown in FIG. 2A-FIG. 2L, compared to an existing smallest memory cell with an SONOS structure, does not have an additional photomask added in its manufacturing process, and the effect of forming the barrier wall is achieved simply by depositing another layer of dielectric material and by adjusting the exposure used in conjunction with an existing photomask, and after forming the barrier wall, polycrystalline silicon deposition and subsequent etching need to be performed only once to form both the select gate and the memory gate of the smallest memory cell. Viewing from the manufacturing process, it is possible to optimally obtain the transistor with an SONOS structure by using existing tools by simple steps.

Viewing from the structure, in the transistor provided in the present disclosure that is manufactured by using the method provided in the present disclosure, the material of the above barrier wall is of a dielectric material, and since the barrier wall dielectric is deposited separately, the formation of the barrier wall is independent of the formation of the ONO memory layer, and the barrier wall material may be replaced according to different requirements of the smallest memory cell. Furthermore, for the width of the above barrier wall, different exposures may be adjusted during subsequent etching to adjust the coverage of the photoresist so as to define different widths of the barrier wall, so that the transistor manufactured by using the method provided in the present disclosure can satisfy different operating voltage requirements, and has better practicality. By means of the design of the barrier wall, the select gate and the memory gate that originally are separate and spaced by a long distance can be formed on the two sides of the above barrier wall, and can be electrically separated from each other without interfering with each other by means of the barrier wall, which can reduce the dimension of the transistor while meeting operating requirements of the smallest memory cell.

FIG. 3A-FIG. 3K show simplified diagrams illustrating a process procedure for providing a transistor with an SONOS structure according to another embodiment of the present disclosure. These diagrams provide examples only and should not unduly limit the scope of the claims. Depending on implementations, one or more steps may be added, removed, repeated, rearranged, modified, replaced, and/or alternated without affecting the scope of the claims.

Figure 3A:
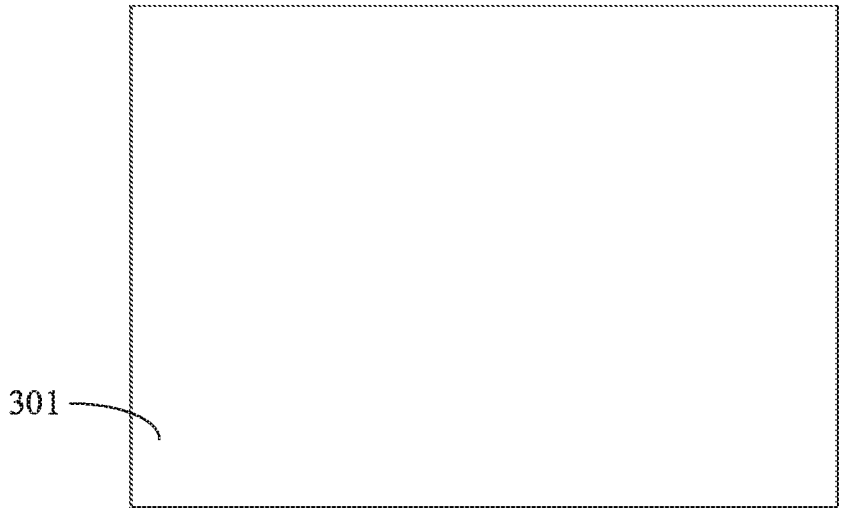
FIG. 3A-FIG. 3K show schematic structural diagrams of a transistor in a manufacturing process according to another embodiment provided in the present disclosure.

As shown in FIG. 3A, a semiconductor substrate 301 used in the present disclosure is provided first. The substrate 301 may be a semiconductor wafer such as a silicon wafer. Alternatively or additionally, the substrate 301 may include an elemental semiconductor material, a compound semiconductor material, and/or an alloy semiconductor material. Examples of elemental semiconductor materials may be, but are not limited to, crystalline silicon, polycrystalline silicon, amorphous silicon, germanium, and/or diamond. Examples of compound semiconductor materials may be, but not limited to, silicon carbide, gallium arsenide, gallium phosphide, indium phosphide, indium arsenide, and/or indium antimonide. Examples of alloy semiconductor materials may be, but not limited to, SiGe, GaAsP, AlInAs, AlGaAs, GaInAs, GaInP, and/or GaInAsP.

Figure 3B:
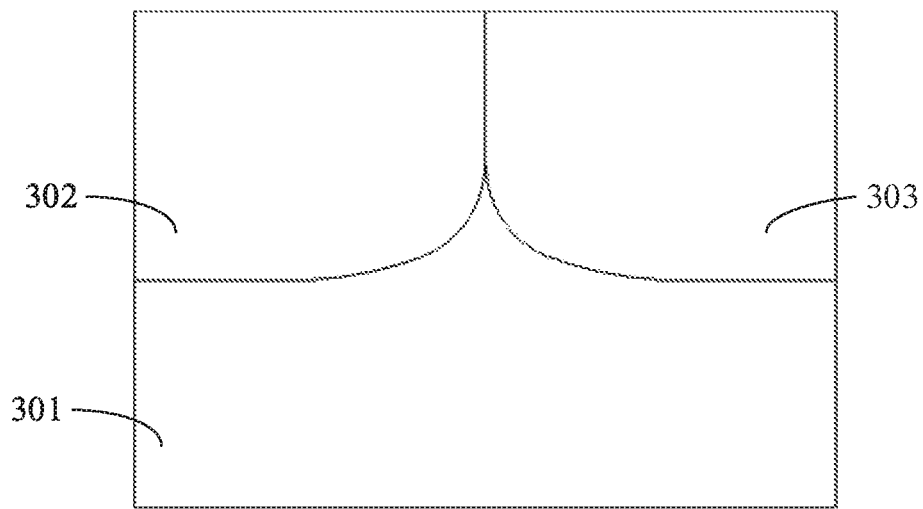

FIG. 3B shows ion implantation in the substrate 301 to form a select transistor well 302 and a memory transistor well 303 of the transistor. In this embodiment, the substrate 301 is N-type doped, and the select transistor well 302 and the memory transistor well 303 are P-type wells. In some embodiments, the substrate 301 may also be P-type doped, and the select transistor well 302 and the memory transistor well 303 may also be N-type wells. The formation of each well includes at least three to five steps to complete the fabrication, including, but not limited to, epitaxial growth, native oxide growth, ion implantation using a mask, and another high-energy ion implantation and annealing.

Figure 3C:
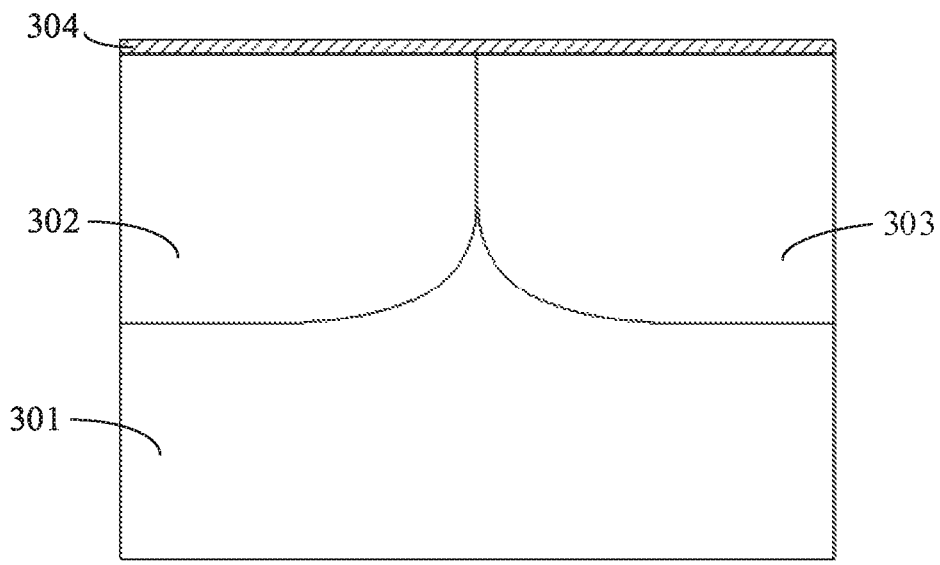
Figure 3D:
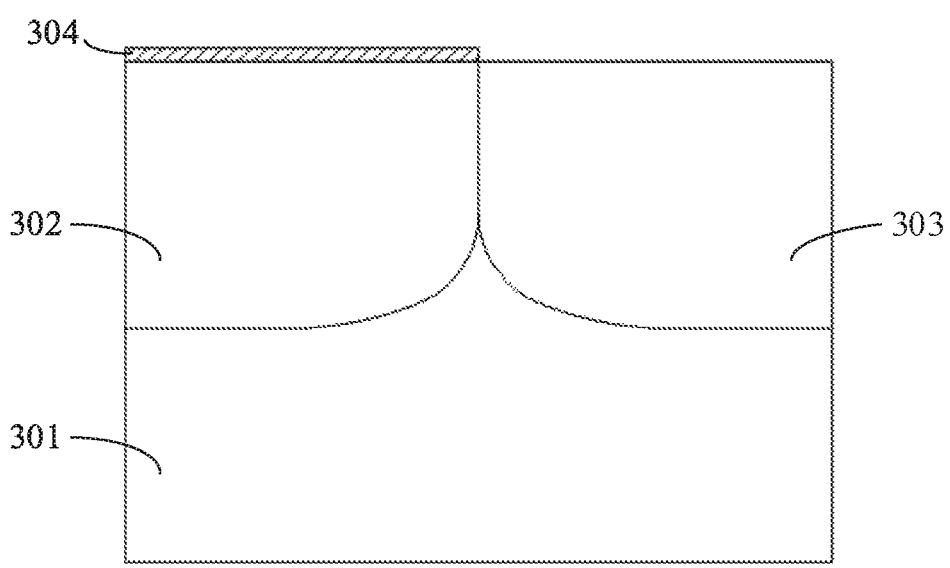

FIG. 3C-FIG. 3D show schematic structural diagrams of the transistor in a process of forming an oxide layer on an upper surface of the select transistor well 302. As shown in FIG. 3C, an oxide layer 304 is first deposited on a surface of the semiconductor substrate 301. The above deposition process includes, but is not limited to, forming the above oxide layer 304 by chemical vapor deposition (CVD), physical vapor deposition (PVD), atomic layer deposition (ALD), high density plasma CVD (HDPCVD), metal organic CVD (MOCVD), or plasma enhanced CVD (PECVD). As shown in FIG. 3D, the oxide layer on the upper surface of the select transistor well region 302 is retained by etching the oxide layer on an upper surface of the memory transistor well region 303. The above etching process may include dry etching, wet etching, and/or other etching methods (such as reactive ion etching). The etching process may also be purely chemical (plasma etching), purely physical (ion milling), and/or a combination of the foregoing.

In the above process, it is necessary to remove the oxide layer on the surface of the memotron 303 and retain the oxide layer on the upper surface of the selectron 302. It is necessary to define the surface material region needing to be etched off by means of pattern etching by using a mask layer (usually a patterned photoresist), and a selected portion is etched off during etching, which is the oxide layer on the surface of the memotron 303 in this step in this embodiment. The above patterning process may include photoresist coating (for example, spin coating), soft baking, photomask alignment, exposure, post-exposure baking, photoresist development, rinsing, drying (for example, hard baking), other suitable processes, and/or combinations thereof. In this embodiment, the above portion to be etched is patterned using a first photomask and a preset exposure of X2. In one embodiment, the above first photomask may reuse one of photomasks used in the prior art to form the conventional smallest memory cell as shown in FIG. 1, without the need to separately design and manufacture an additional photomask.

Figure 3E:
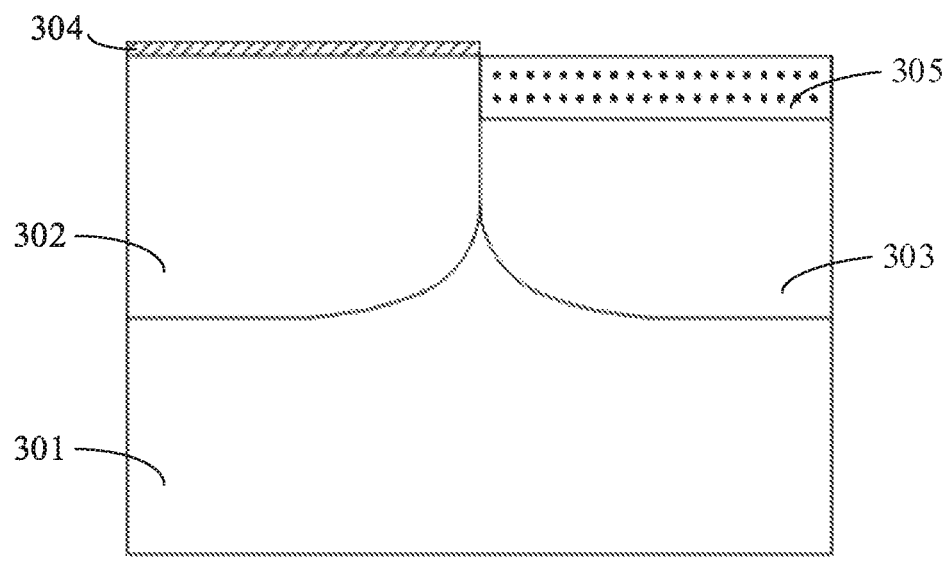

FIG. 3E shows a schematic structural diagram of the transistor after shallow trench ion implantation is performed in the memory transistor well 303. In this step, shallow trench ion implantation may need to be performed on the memory transistor well 303 region to form shallow trench doping 305, without the need for performing ion implantation on the select transistor well 302 region. Therefore, a patterned photoresist is still needed to define a region where ion implantation is to be performed. The above patterning process may include photoresist coating (for example, spin coating), soft baking, photomask alignment, exposure, post-exposure baking, photoresist development, rinsing, drying (for example, hard baking), other suitable processes, and/or combinations thereof. In this embodiment, the above region to be ion-implanted is patterned using the first photomask and the preset exposure of X2. In one embodiment, the above first photomask may reuse one of photomasks used in the prior art to form the conventional smallest memory cell as shown in FIG. 1, without the need to separately design and manufacture an additional photomask.

In another embodiment, the above shallow trench ion implantation process is performed after forming the oxide layer 304 on the upper surface of the select transistor well 302 region as shown in FIG. 3C-FIG. 3D, and then the patterned photoresist in the process shown in FIG. 3C-FIG. 3D is reused to define the region where ion implantation is performed, that is, the memory transistor well 303 region.

The ion implantation as shown in FIG. 3E, where the above ion implantation is P-type doping if the memory transistor is an N-type tube, may have a dopant such as boron (B), indium (In), or another group III element, and the junction depth of the above ion implantation is set according to the electrical performance of the memory transistor well 303 region. The memory transistor well 303 region is P-type doped as a well for a memory transistor. If the memory transistor well is a P-type well, the above ion implantation may be N-type doping, and the dopant may be phosphorus (P), arsenic (As), or another Group V element.

Figure 3F:
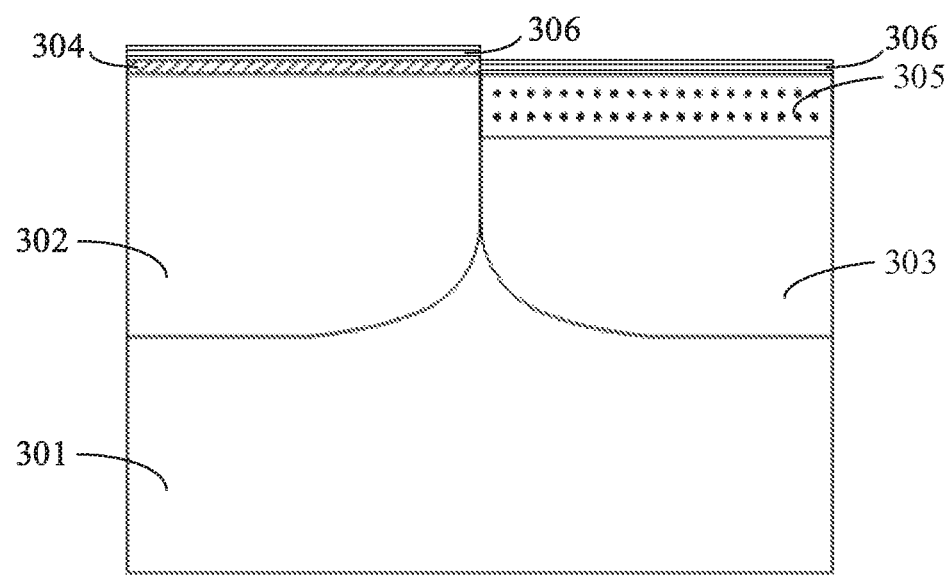

FIG. 3F shows a schematic structural diagram of the transistor in a process of forming an ONO layer on the surface of the transistor. The process of depositing the oxide layer 306 on the surface of the semiconductor substrate 301 includes sequentially depositing a first oxide layer, a nitride layer, and a second oxide layer on the transistor. The above deposition process includes, but is not limited to, forming the above ONO layer 306 by chemical vapor deposition (CVD), physical vapor deposition (PVD), atomic layer deposition (ALD), high density plasma CVD (HDPCVD), metal organic CVD (MOCVD), or plasma enhanced CVD (PECVD).

In this embodiment, after the ONO layer 306 is deposited on the surface of the transistor as shown in FIG. 3F, an isolation dielectric layer 307 is deposited on a surface of the above ONO layer. The above deposition process includes, but is not limited to, forming the above isolation dielectric 307 by chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 3G:
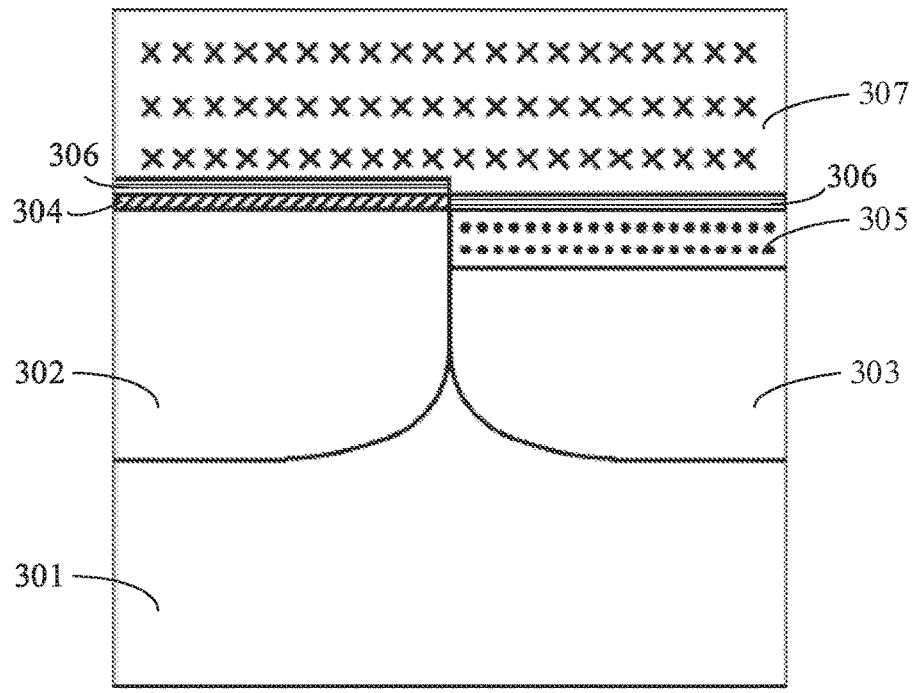
Figure 3H:
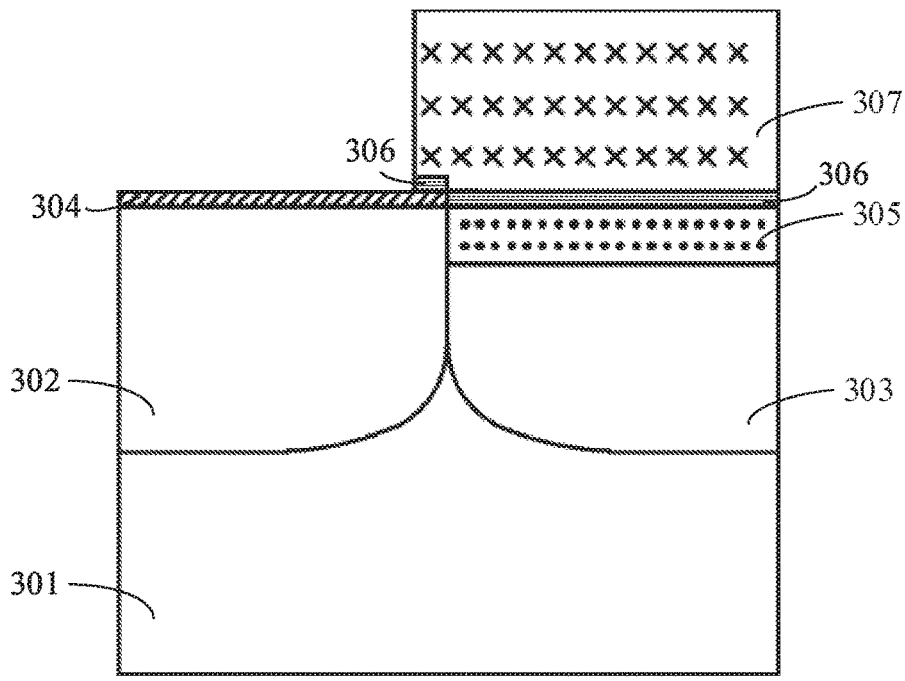

As shown in FIG. 3H, the barrier wall dielectric layer on the memory transistor well 303 region and the ONO layer and the barrier wall dielectric layer at the junction of the select transistor well 302 and the memory transistor well 303 are retained by etching the ONO layer and the barrier wall dielectric layer on a portion of the select transistor well region 302. The above etching process may include dry etching, wet etching, and/or other etching methods (such as reactive ion etching). The etching process may also be purely chemical (plasma etching), purely physical (ion milling), and/or a combination of the foregoing.

In the above process, it is necessary to remove the ONO layer and the barrier wall dielectric layer on a part of the select transistor well 302 while retaining the barrier wall dielectric layer on the memory transistor well 303 region and the ONO layer and the barrier wall dielectric layer at the junction of the select transistor well 302 and the memory transistor well 303. It is necessary to define the surface material region needing to be etched off by means of pattern etching by using a mask layer (usually a patterned photoresist), and a selected portion is etched off during etching, which is the ONO layer and the barrier wall dielectric layer on the surface of the part of the memory transistor well 303 in this step in this embodiment. The above patterning process may include photoresist coating (for example, spin coating), soft baking, photomask alignment, exposure, post-exposure baking, photoresist development, rinsing, drying (for example, hard baking), other suitable processes, and/or combinations thereof.

In this embodiment, the above portion to be etched is patterned using a second photomask and a preset exposure of Y1. In one embodiment, the above second photomask may reuse one of photomasks used in the prior art to form the conventional smallest memory cell as shown in FIG. 1, without the need to separately design and manufacture an additional photomask.

Since both the ONO layer and the portion of the barrier wall dielectric layer on the select transistor well 302 region are ultimately to be removed and photoresist portions defined by the photomask used during the etching are consistent, in this embodiment, a method of directly depositing a barrier wall dielectric layer on the above ONO layer can be used, saving the steps of first etching the ONO layer on the select transistor well 302 region and then deposition.

In this embodiment, the preset exposure of Y1 is used, and when the ONO layer and the barrier wall dielectric layer on the select transistor well 302 region, the value of the above exposure Y1 enables retaining the ONO layer and the barrier wall dielectric layer on the select transistor well 302 region at the junction of the select transistor well 302 and the memory transistor well 303. The widths of the above retained ONO layer and the barrier wall dielectric layer on the portion of the select transistor well 302 region are adjusted according to the exposure. When the value of Y1 is smaller, the retained barrier wall dielectric layer is more, and the width of the subsequent formed barrier wall is greater, enabling the smallest memory cell to operate at a higher voltage.

In the above manner, the manufacturing method of the transistor with an SONOS structure provided in the present disclosure can be more succinct. Although there exists an ONO layer under the barrier wall in the vicinity of the select transistor well 302 region by using the above method, the ONO layer in this portion is a dielectric layer, and is located under the barrier wall, and may not affect the performance of the barrier wall, and the barrier wall can still function to space the select gate and the memory gate.

Figure 3I:
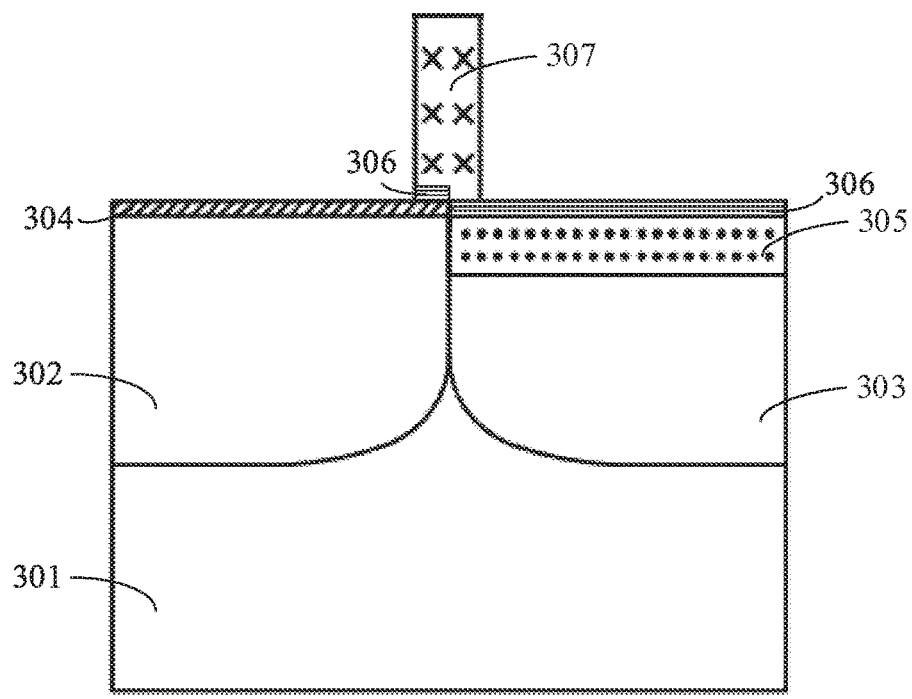

As shown in FIG. 3I, the barrier wall dielectric layer at the junction of the select transistor well 302 and the memory transistor well 303 is retained by etching the barrier wall dielectric layer on a portion of the memory transistor well region 303, so as to form a barrier wall structure. The above etching process may include dry etching, wet etching, and/or other etching methods (such as reactive ion etching). The etching process may also be purely chemical (plasma etching), purely physical (ion milling), and/or a combination of the foregoing.

In the above process, it is necessary to remove the barrier wall dielectric layer on a part of the memory transistor well 303 while retaining the barrier wall dielectric layer at the junction of the select transistor well 302 and the memory transistor well 303. It is necessary to define the surface material region needing to be etched off by means of pattern etching by using a mask layer (usually a patterned photoresist), and a selected portion is etched off during etching, which is the barrier wall dielectric layer on the surface of the part of the memory transistor well 303 in this step in this embodiment. The above patterning process may include photoresist coating (for example, spin coating), soft baking, photomask alignment, exposure, post-exposure baking, photoresist development, rinsing, drying (for example, hard baking), other suitable processes, and/or combinations thereof. In this embodiment, above portion to be etched is patterned using the first photomask and the preset exposure of X1 used in the step as shown in FIG. 3D, without the need to separately design and manufacture an additional photomask. Since the pattern to be etched is the same as that of removing the oxide layer on the memory transistor well 303 region in the step as shown in FIG. 3D, with a difference in dimension, the above dimension may be adjusted by controlling the exposure. The photomask determines an exposed pattern of the photoresist. In the exposure process, the dimension of the pattern can be adjusted by adjusting the energy of the light, that is, the exposure in this application. Common factories may adjust the size of the exposed pattern in this way, and lower energy may result in a smaller pattern, that is, the etched region is smaller. Therefore, in this embodiment, the preset exposure of X1 is used, and the value of the above exposure X1 is less than the exposure of X2 in the step as shown in FIG. 3D, so that upon removal of the barrier wall dielectric layer on the memory transistor well 303 region, the barrier wall dielectric layer on the portion of the memory transistor well 303 region can be retained at the junction of the select transistor well 302 and the memory transistor well 303 region. The width of the above retained barrier wall dielectric layer on the portion of the memory transistor well 303 region is adjusted according to the exposure. When the value of X1 is smaller, the retained barrier wall dielectric layer is more, and the width of the subsequent formed barrier wall is greater, enabling the smallest memory cell to operate at a higher voltage.

The transistor, as shown in FIG. 3I, eventually forms a barrier wall over adjacent portions of the select transistor well 302 region and the memory transistor well 303 region. The material of the above barrier wall is the dielectric material deposited in the step as shown in FIG. 3G. In one embodiment, the above dielectric material may use silicon nitride. Furthermore, as described above, the width of the barrier wall is associated with the exposures Y1 and X1 used in the steps as shown in FIG. 3H and FIG. 3I. The width of the barrier wall is related to the operating voltage of the smallest memory cell. When the operating voltage of the smallest memory cell is higher, a thicker barrier wall is needed to ensure that the barrier wall may not break down at the higher operating voltage, and enable the isolation of the select gate from the memory gate and ensure that the smallest memory cell operates in a safe state. When the operating voltage of the smallest memory cell is lower, the width of the above barrier wall may be appropriately reduced while ensuring the safety performance, so as to achieve the effect of reducing the volume of the transistor more optimally.

Figure 3J:
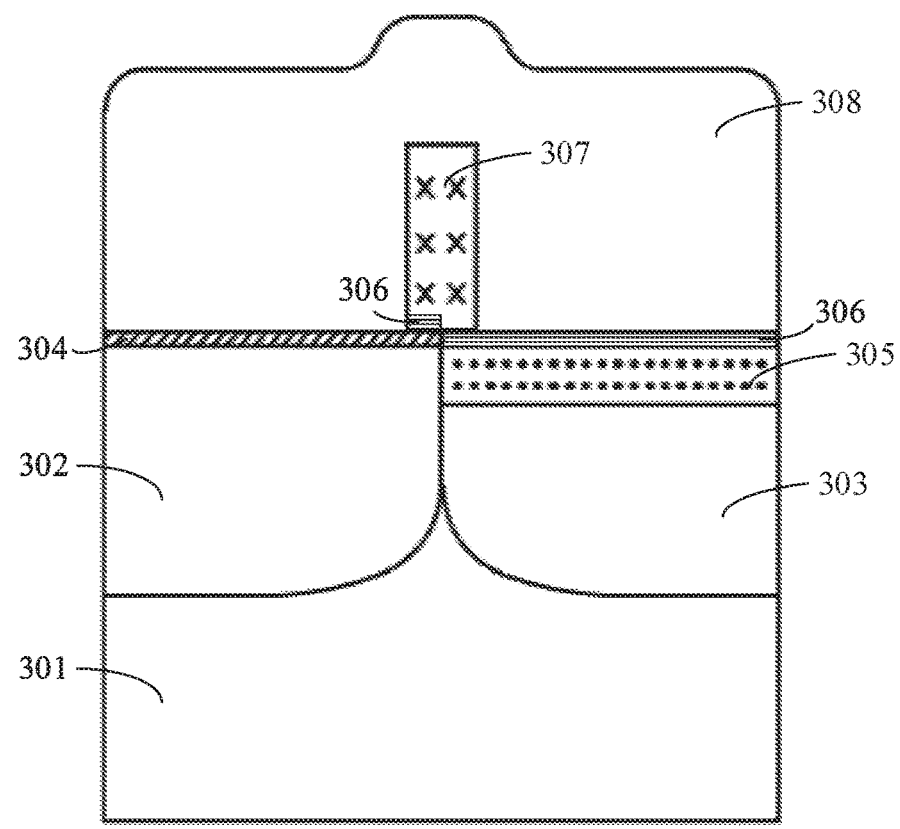
Figure 3K:
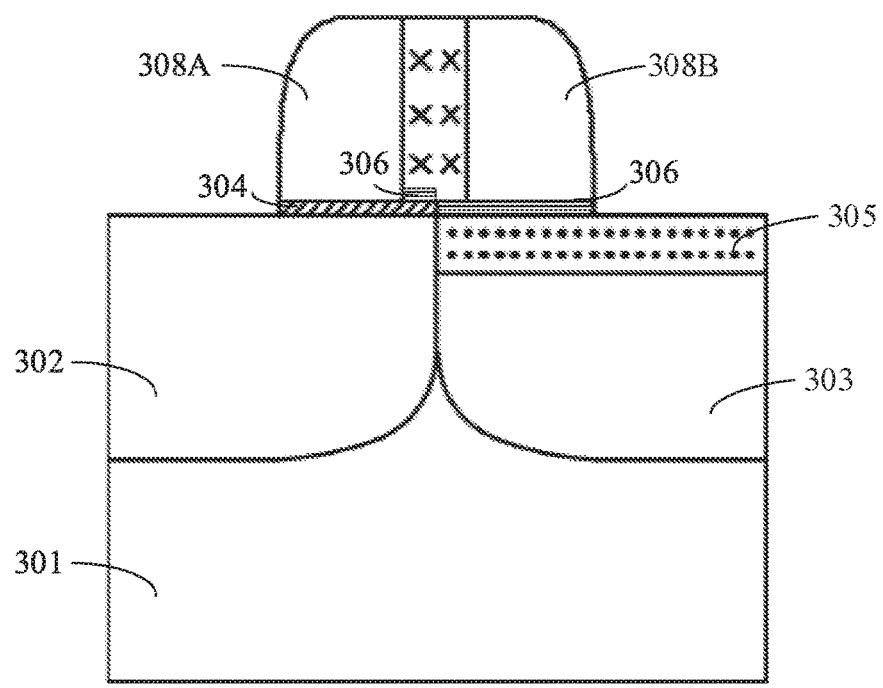

FIG. 3J-FIG. 3K show schematic structural diagrams in a process of forming the select gate and the memory gate of the smallest memory cell. As shown in FIG. 3J, polycrystalline silicon 308 is deposited on the transistor. The above deposition process includes, but is not limited to, forming the above polycrystalline silicon 308 by chemical vapor deposition (CVD), physical vapor deposition (PVD), atomic layer deposition (ALD), high density plasma CVD (HDP-CVD), metal organic CVD (MOCVD), or plasma enhanced CVD (PECVD). FIG. 3K shows a schematic structural diagram of the smallest memory cell after etching. The polycrystalline silicon 308 formed on two sides of the barrier wall is retained by etching according to requirements of the smallest memory cell for the select gate and the memory gate, and due to the existence of the barrier wall, the select gate 308A and the memory gate 308B are formed on the two sides of the barrier wall. Moreover, while the above select gate 308A and the memory gate 308B are formed by etching, the superfluous oxide layer over the select transistor well 302 where the select gate 308A region is not formed is removed, and the superfluous ONO layer above the memory transistor well 303 where the memory gate 308B is not formed is removed.

The above select gate 308A and the memory gate 308B are formed symmetrically to each other on the two sides of the barrier wall at the same time to form both the select gate 308A and the memory gate 308B with symmetric structures, so that effects of the manufacturing process on the select gate 308A and the memory gate 308B are quite close, which can prevent the occurrence of errors therebetween. In this embodiment, the effect of forming both the select gate 308A and the select gate 308B can be achieved without the need of depositing the polycrystalline silicon a plurality of times, and different from depending on a photomask plate, photoetching, and etching, the trench length of the gate tubes depends on only etching of the polycrystalline silicon layer, which greatly improves the uniformity among transistors and improves the reliability of a memory region. The smallest memory cell as shown in FIG. 3A-FIG. 3K, compared to an existing smallest memory cell with an SONOS structure, does not have an additional photomask added in its manufacturing process, and the effect of forming the barrier wall is achieved simply by depositing another layer of dielectric material and by adjusting the exposure used in conjunction with an existing photomask, and after forming the barrier wall, polycrystalline silicon deposition and subsequent etching need to be performed only once to form both the select gate and the memory gate of the smallest memory cell. Furthermore, compared with the method provided in the present disclosure as shown in FIG. 2A-FIG. 2L, one step of etching is further reduced, so that a manufacturing procedure can be streamlined with SONOS performance unchanged, and it is possible to optimally obtain the transistor with an SONOS structure by using existing tools by simple steps.

Viewing from the structure, in the transistor provided in the present disclosure that is manufactured by using the method provided in the present disclosure, the material of the above barrier wall is of a dielectric material, and since the barrier wall dielectric is deposited separately, the formation of the barrier wall is independent of the formation of the ONO memory layer, and the barrier wall material may be replaced according to different requirements of the smallest memory cell. Furthermore, for the width of the above barrier wall, different exposures may be adjusted during subsequent etching to adjust the coverage of the photoresist so as to define different widths of the barrier wall, so that the transistor manufactured by using the method provided in the present disclosure can satisfy different operating voltage requirements, and has better practicality. By means of the design of the barrier wall, the select gate and the memory gate that originally are separate and spaced by a long distance can be formed on the two sides of the above barrier wall, and can be electrically separated from each other without interfering with each other by means of the barrier wall, which can reduce the dimension of the transistor while meeting operating requirements of the smallest memory cell.

Therefore, the embodiments of the method for fabricating a transistor with an SONOS structure and the structure thereof have been described. Although the present disclosure has been described with respect to certain exemplary embodiments, it may be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments may need more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A manufacturing method for a transistor with a SONOS structure, the method comprising:

providing a semiconductor substrate, wherein the semiconductor substrate comprises a select transistor well and a memory transistor well;

depositing an oxide layer on an upper surface of the select transistor well;

depositing an ONO memory layer on an upper surface of the memory transistor well;

depositing a barrier wall over adjacent portions of the select transistor well and the memory transistor well;

depositing polycrystalline silicon covering the oxide layer, the ONO memory layer, and the barrier wall, and etching the polycrystalline silicon to retain the polycrystalline silicon deposited on both sides of the barrier wall forming a select gate and a memory gate; and removing the oxide layer and the ONO layer on a surface of the semiconductor substrate other than the select gate, the barrier wall, and the memory gate.

2. The manufacturing method of claim 1, wherein the depositing of the barrier wall comprises:

depositing an isolation dielectric layer covering the oxide layer and the ONO memory layer;

etching a portion of the isolation dielectric layer over the memory transistor well by using a first photomask and a preset exposure X1, to retain the isolation dielectric layer over the select transistor well and the portion of the memory transistor well adjacent to the select transistor well; and etching a portion of the isolation dielectric layer over the select transistor well by using a second photomask and a preset exposure Y1, to retain the isolation dielectric layer over the adjacent portions of the select transistor well and the memory transistor well so as to form the barrier wall, wherein the exposure X1 and the exposure Y1 are adjusted according to the width of the barrier wall.

3. The manufacturing method of claim 2, wherein the forming of the oxide layer comprises:

depositing an oxide layer on the surface of the semiconductor substrate; and etching the oxide layer on the upper surface of the memory transistor well region by using the first photomask and a preset exposure X2, to retain the oxide layer on the upper surface of the select transistor well region, wherein the exposure X2 is greater than the exposure X1 to etch the oxide layer over the entire upper surface of the memory transistor well region.

4. The manufacturing method of claim 3, further comprising:

performing shallow trench ion implantation on the memory transistor well by using the first photomask, forming shallow trench doping.

5. The manufacturing method of claim 2, wherein the forming of the ONO memory layer on the upper surface of the memory transistor well comprises:

depositing an ONO memory layer covering the oxide layer and the upper surface of the memory transistor well region of the semiconductor substrate; and etching the ONO memory layer over the select transistor well region by using the second photomask and a preset exposure Y2, to retain the ONO memory layer on the upper surface of the memory transistor well region, wherein the exposure Y2 is greater than the exposure Y1 to etch the ONO memory layer over the entire select transistor well region.

6. The manufacturing method of claim 5, wherein the depositing of the ONO memory layer covering the oxide layer and the upper surface of the memory transistor well region of the semiconductor substrate comprises:

sequentially depositing a first oxide layer, a nitride layer, and a second oxide layer.

7. The manufacturing method of claim 2, wherein the forming of the ONO memory layer on the upper surface of the memory transistor well comprises:

depositing an ONO memory layer covering the oxide layer and the upper surface of the memory transistor well region of the semiconductor substrate, wherein the isolation dielectric layer is deposited on an upper surface of the ONO memory layer; and etching portions of both the isolation dielectric layer and the ONO memory layer over the select transistor well by using the second photomask and the preset exposure Y1, to retain the ONO memory layer over the upper surface of the memory transistor well and the portion of the select transistor well adjacent to the memory transistor well.

8. The manufacturing method of claim 1, wherein the memory transistor well and the select transistor well are formed by performing ion implantation.

9. The manufacturing method of claim 1, wherein the barrier wall is of a dielectric material, and the width of the barrier wall is set according to operating voltages of the select transistor and the memory transistor.

10. The manufacturing method of claim 9, wherein the dielectric material is silicon nitride.

11. The manufacturing method of claim 1, wherein the semiconductor substrate is N-type doped, and the select transistor well and the memory transistor well are P-type doped.

12. The manufacturing method of claim 1, wherein the semiconductor substrate is P-type doped, and the select transistor well and the memory transistor well are N-type doped.

* * * * *